(12) United States Patent
Liu

(10) Patent No.: US 7,215,274 B2
(45) Date of Patent: May 8, 2007

(54) REFERENCE VOLTAGE PRE-CHARGE IN A MULTI-STEP SUB-RANGING ANALOG-TO-DIGITAL CONVERTER

(75) Inventor: Song Liu, Cupertino, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/213,393

(22) Filed: Aug. 26, 2005

(65) Prior Publication Data

US 2007/0024484 A1 Feb. 1, 2007

Related U.S. Application Data

(60) Provisional application No. 60/703,989, filed on Jul. 29, 2005.

(51) Int. Cl.
*H03M 1/12* (2006.01)

(52) U.S. Cl. ............... 341/156; 341/122; 341/155

(58) Field of Classification Search ............ 341/156
See application file for complete search history.

(56) References Cited

U.S. PATENT DOCUMENTS

| 6,014,097 | A  | * | 1/2000 | Brandt ............. 341/156 |
| 6,177,899 | B1 | * | 1/2001 | Hsu ............... 341/156 |
| 6,232,907 | B1 | * | 5/2001 | Nagaraj et al. ..... 341/159 |
| 6,606,049 | B1 | * | 8/2003 | Marble ............ 341/155 |

\* cited by examiner

*Primary Examiner*—Khai M. Nguyen

(57) ABSTRACT

Multi-step sub-ranging analog-to-digital converters (ADCs) utilize a plurality of converter modules to generate sub-ranges of bits for a digital output signal during a multi-phase conversion cycle. Each subsequent converter utilizes reference voltage levels corresponding to conversions performed by prior converters during the timing phases of the conversion cycle. Settling time for these reference voltages, which limits the speed and/or accuracy of each conversion, may be reduced by pre-charging the reference input nodes of the subsequent converters using the analog input signal during a timing phase in which a prior converter is converting the analog input signal to generate one of the sub-ranges for the digital output signal.

24 Claims, 5 Drawing Sheets

REFERENCE VOLTAGE PRE-CHARGE IN A MULTI-STEP SUB-RANGING ANALOG-TO-DIGITAL CONVERTER

CROSS-REFERENCE TO RELATED APPLICATIONS

This application claims the benefit of the filing date of U.S. provisional application No. 60/703,989, filed on Jul. 29, 2005, the teachings of which are incorporated herein by reference.

BACKGROUND OF THE INVENTION

1. Field of the Invention

The present invention relates to electronics, and, in particular, to multi-step sub-ranging analog-to-digital converters.

2. Description of Related Art

FIG. 1 illustrates a block diagram of a conventional two-step sub-ranging analog-to-digital converter (ADC) 100. ADC 100 comprises a front-end Sample-and-Hold (S/H) module 101, a coarse converter 103, a fine converter 104, a reference ladder 105, a reference switch network 102, and an encoder 106. An analog input signal 111 is received by S/H module 101, which provides a stable input signal 112 for application to coarse converter module 103 and fine converter module 104.

Input signal 112 is converted by coarse converter 103 during a first phase of a conversion cycle based on a subset of reference voltages 113 provided by reference ladder 105. Coarse converter 103 generates one or more of the most significant bit (MSB) values (115) for the digital representation 117 of analog input signal 111. During a second phase of the conversion cycle, fine converter 104 converts input signal 112 to generate one or more of the least significant bit (LSB) values (116) for the digital representation of analog input signal 111. During this second phase, reference switch network 102 provides a different subset of reference voltages 114 to fine converter 104, where reference voltages 114 are selected based upon a control signal 120 generated by coarse converter 103 corresponding to the MSB values generated during the first phase of the conversion cycle. Encoder 117 combines the MSB values generated by coarse converter 103 and the LSB values generated by fine converter 104 to generate digital output signal 117.

Coarse converter 103 and fine converter 104 may be constructed using any suitable ADC circuits that provide the desired resolutions and accuracies. For example, in one possible embodiment, each converter is constructed using a set of analog comparators. Each of these comparators compares input signal 112 with a different reference voltage. Assume, for example, that ADC 100 generates an 8-bit digital output signal 117, where coarse converter 103 generates the four MSBs and fine converter 104 generates the four LSBs of output signal 117. In that case, reference ladder 105 generates $2^8-1$ or 255 different (e.g., equally spaced) reference voltages that span the dynamic range of ADC 100. Assume, for ease of explanation, that the dynamic range of ADC 100 is from 0V to 256 mV, and that reference ladder 105 generates 255 reference voltages from 1 mV to 255 mV at 1-mV increments.

Continuing with this 8-bit ADC example, 4-bit coarse converter 103 and 4-bit fine converter 104 are both implemented with 15 comparators. During the first phase of the conversion cycle, coarse converter 103 receives 15 "coarse" reference voltages (e.g., corresponding to 16 mV, 32 mV, 48 mV, ..., 240 mV), where each of the 15 comparators in coarse converter 103 compares input signal 112 to a different one of these 15 coarse reference voltages. The largest of these 15 coarse reference voltages that is smaller than input signal 112 (as determined by the comparator outputs) identifies the 4 MSBs of digital output 117. Assume, for example, that this "largest smaller" coarse reference voltage is 144 mV.

Coarse converter 103 generates control signal 120 based on this largest coarse reference voltage. Based on control signal 120, reference switch network 102 selects 15 "fine" reference voltages from the 255 different reference voltages 113 generated by reference ladder 105 to provide to fine converter 104. Continuing with the example in which the "largest smaller" coarse reference voltage is 144 mV, reference switch network 102 would select the following 15 fine reference voltages for use by fine converter 104: 145 mV, 146 mV, 147 mv, ..., 159 mV. During the second phase of the conversion cycle, fine converter 104 receives the 15 selected fine reference voltages, where each of the 15 fine-converter comparators compares input signal 112 to a different one of these 15 fine reference voltages. The largest of these 15 fine reference voltages that is smaller than input signal 112 identifies the 4 LSBs of digital output 117.

FIG. 2 illustrates a signal flow diagram for one of the fine reference voltages selected by reference switch network 102 of FIG. 1 for use by fine converter 104 during the second phase of the conversion cycle. One of the design challenges of two-step sub-ranging ADC 100 of FIG. 1 is the settling accuracy of reference switch network 102 when changing fine reference voltages 114 for fine converter 104 for different input signals. This settling error has to be lower than a certain level for a specific resolution requirement of ADC 100. One major contributor to the settling error is a "memory effect" caused by electric charge stored at each reference input node 203 of fine converter 104. The memory effect occurs because of parasitic capacitance 205 between each output node of reference switch network 102 and the corresponding reference input node to fine converter 104. The reference settling process, and therefore the final settling accuracy, depends on the fine reference voltage levels of the previous conversion cycle stored on parasitic capacitances (205) at the interface between reference switch network 102 and the reference input nodes of fine converter 104.

For example, the settling error would be higher if the differences between the current fine reference voltages and the previous fine reference voltages become larger. In particular, because of the memory effect from parasitic capacitance 205, more time would be needed for the voltages at the reference input nodes of fine converter 104 to settle to the current fine reference voltages from the previous reference voltages. This memory effect causes an input-dependent settling error that lowers the observed Signal-to-Noise Ratio (SNR), and therefore the Effective Number of Bits (ENOB), of ADC 100. This problem becomes more severe in high-speed applications, where the input slew rate for analog input signal 111 of FIG. 1, and therefore the slew rate of reference switching network 102, is high and the time for reference switching is short. Other contributors to the reference settling error may include signal-dependent non-linearity and charge injection of the switch devices used in reference switch network 102.

Attempts to reduce these errors caused by the memory effect of the previous fine reference voltages stored at the reference input nodes of fine converter 104 include increasing driving current within reference ladder 105. This increase in the drive current attempts to lower the RC time constant of reference ladder 105, which drives reference switch network 102, and by lowering the resistance of switches within reference switch network 102. This approach increases the power consumption of ADC 100 and requires larger switch devices within reference switch network 102, which results in more charge injection.

Another previous attempt to reduce the reference settling error was to use two interleaved fine converters 104, each working at half the conversion rate of ADC 100. Although this architecture relaxes the time for the fine reference voltages to settle for each fine converter and therefore lowers the settling error, the addition of the second interleaved fine converter significantly increases the complexity of ADC 100, demands more die area for the entire circuit, and introduces errors caused by the interleaving operations, e.g., the "ping-pong" noise between the two fine converters.

SUMMARY OF THE INVENTION

Problems in the prior art are addressed in accordance with the principles of the present invention by utilizing a reference voltage pre-charge process using the addition of a switched signal path from an output of a sample-and-hold module to a switched reference voltage used by a fine converter module.

In one embodiment, the present invention is an analog-to-digital converter (ADC) for converting an analog input signal into a digital output signal. The ADC comprises a coarse converter adapted to convert the analog input signal into one or more coarse bits for the digital output signal during an initial phase of a conversion cycle for the ADC, at least one fine converter adapted to convert the analog input signal into one or more fine bits for the digital output signal during a subsequent phase of the conversion cycle, a reference-voltage supply adapted to generate and apply one or more fine reference voltages to one or more reference input nodes of the fine converter for use by the fine converter during the subsequent phase of the conversion cycle, and an encoder module adapted to combine the coarse and fine bits to generate the digital output signal. During the initial phase of the conversion cycle, the ADC is adapted to apply a pre-charge signal based on the analog input signal to at least one reference input node of the fine converter to pre-charge the at least one reference input node.

In another embodiment, the present invention is a method for converting an analog input signal into a digital output signal. The method converts, by a coarse converter, the analog input signal into one or more coarse bits for the digital output signal during an initial phase of an ADC conversion cycle, generates and applies one or more fine reference voltages to one or more reference input nodes of at least one fine converter for use by the fine converter during a subsequent phase of the conversion cycle, converts, by the fine converter, the analog input signal into one or more fine bits for the digital output signal during the subsequent phase of the conversion cycle, and combines the coarse and fine bits to generate the digital output signal. During the initial phase of the conversion cycle, a pre-charge signal based on the analog input signal is applied to at least one reference input node of the fine converter to pre-charge the at least one reference input node.

In yet another embodiment, the present invention is an integrated circuit comprising an ADC for converting an analog input signal into a digital output signal. The ADC comprises a coarse converter adapted to convert the analog input signal into one or more coarse bits for the digital output signal during an initial phase of a conversion cycle for the ADC, at least one fine converter adapted to convert the analog input signal into one or more fine bits for the digital output signal during a subsequent phase of the conversion cycle, a reference-voltage supply adapted to generate and apply one or more fine reference voltages to one or more reference input nodes of the fine converter for use by the fine converter during the subsequent phase of the conversion cycle, and an encoder module adapted to combine the coarse and fine bits to generate the digital output signal. During the initial phase of the conversion cycle, the ADC is adapted to apply a pre-charge signal based on the analog input signal to at least one reference input node of the fine converter to pre-charge the at least one reference input node.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
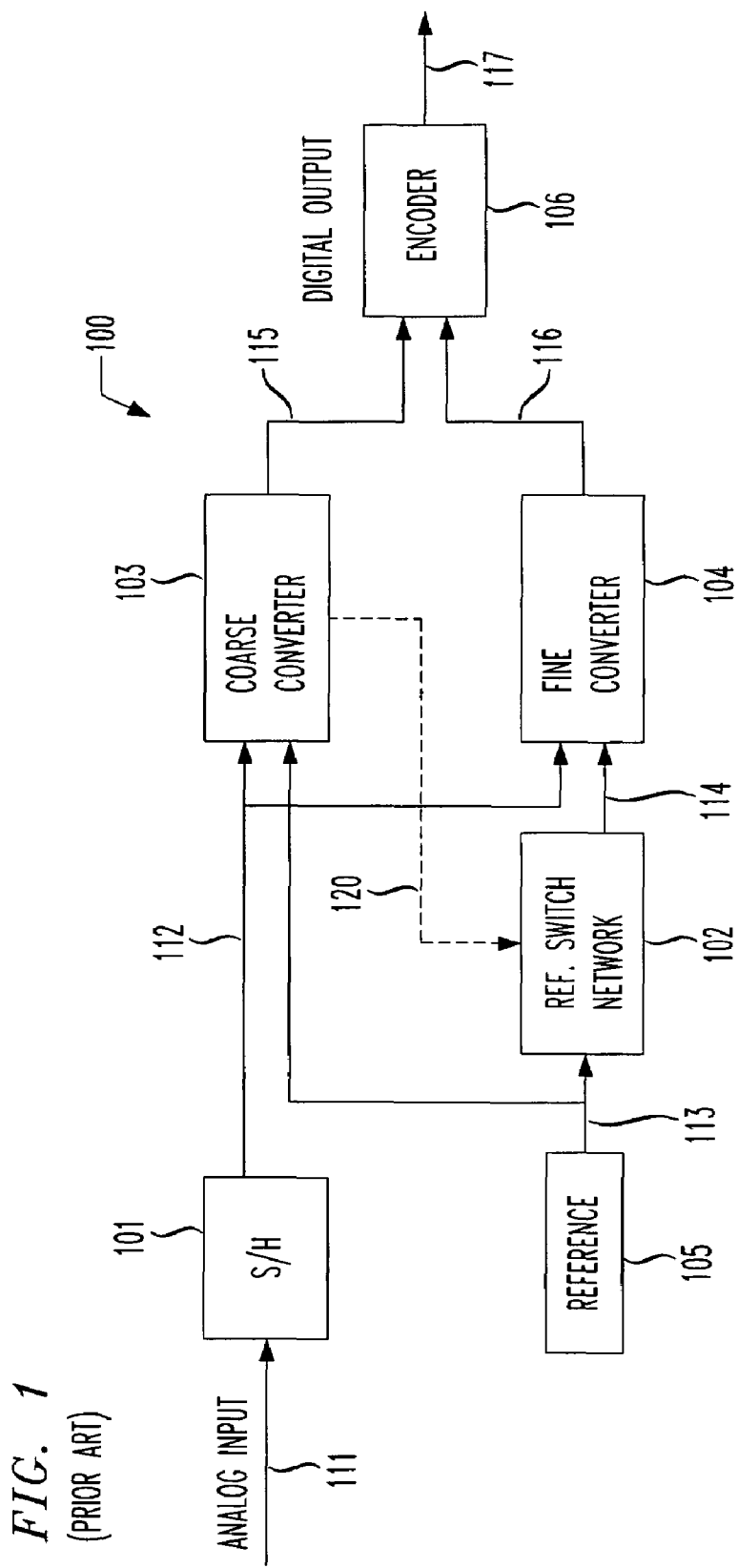
FIG. 1 illustrates a block diagram of a conventional two-step sub-ranging analog-to-digital converter (ADC).
Figure 2:
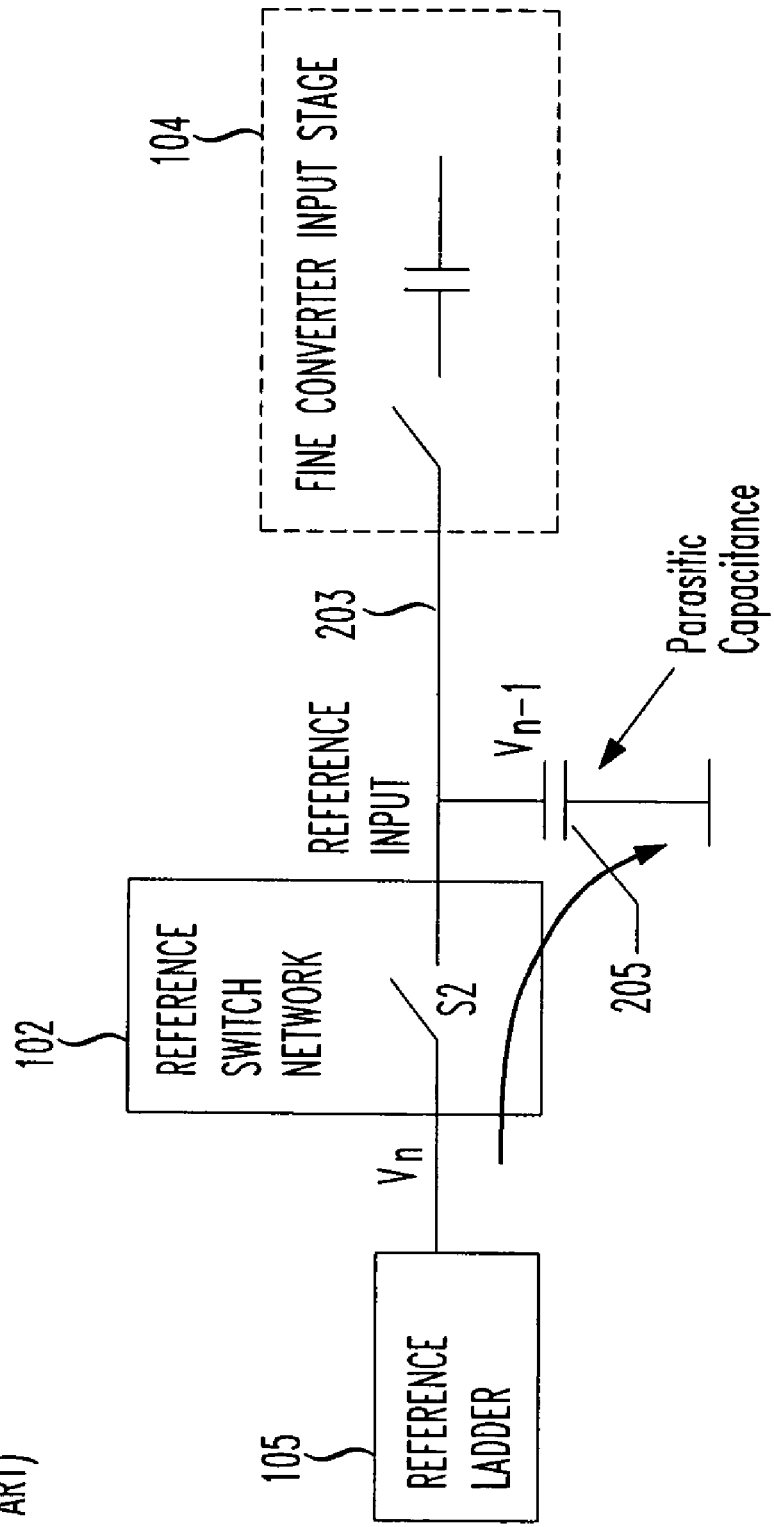
FIG. 2 illustrates a signal flow diagram for one of the fine reference voltages in the ADC of FIG. 1.
Figure 3:
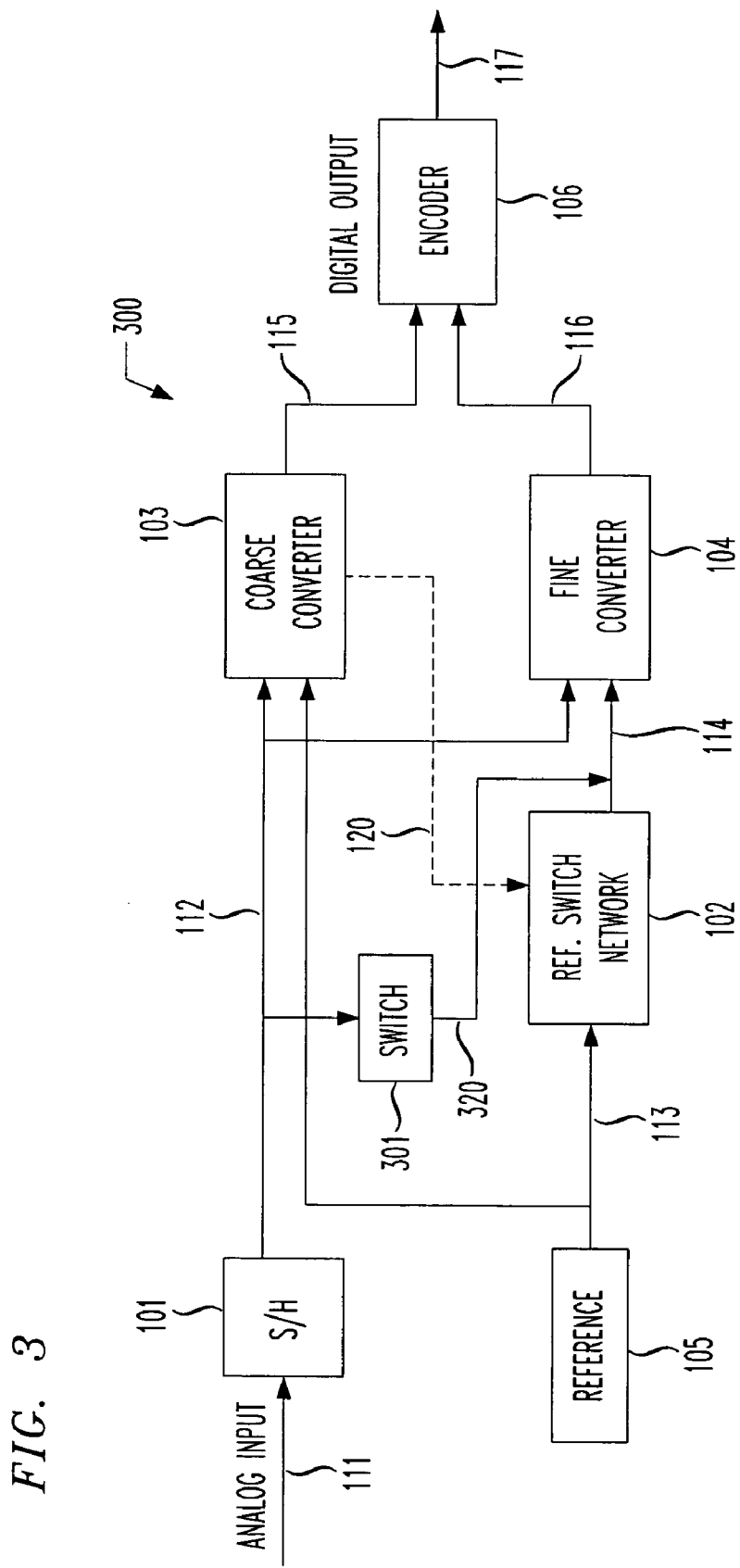
FIG. 3 illustrates a block diagram of a two-step sub-ranging ADC according to an embodiment of the present invention.

FIG. 3 illustrates a block diagram of a two-step sub-ranging analog-to-digital converter (ADC) 300 according to an embodiment of the present invention. ADC 300 operates in the manner described in reference to ADC 100 of FIG. 1 with the addition of pre-charge switch 301 and pre-charge signal 320, which are used to "pre-charge" each reference input node of fine converter 104. In possible implementations of ADC 300, pre-charge signal 320 may be either a buffered or an un-buffered signal when driving the reference input node of fine converter 104.

In particular, while coarse converter 103 is converting input signal 112, pre-charge switch 301 provides input signal 112 as pre-charge signal 320 to pre-charge the fine reference input nodes. Once coarse converter 103 has completed its operation, pre-charge switch 301 switches off pre-charge signal 320, and reference switch network 102 uses control signal 120 to select and apply the set of fine reference voltages used by fine converter module 104. Continuing with the previously described 8-bit ADC example, where the coarse reference voltages applied to coarse converter 103 are separated by 16-mV increments, input signal 112 will be within 16 mV of each fine reference voltage provided by reference switch network 102 to fine converter 104 during the second phase of the conversion cycle. By applying input signal 112, during the first phase, to each reference input node of fine converter 104, the process of settling the input nodes from the previous fine reference voltage levels to the fine reference voltage levels for the current conversion cycle will begin during the first phase, thereby reducing the settling time of the second phase for most situations. Note that, if the MSB values generated by coarse converter 103 do not change from the previous conversion cycle, then the settling time might increase for some or even all of the reference input nodes. However, in this case, the difference between the previous and current reference voltage levels will still be on the order of the resolution of the coarse converter.

In another possible implementation of ADC 300, reference ladder 105 generates only a subset of the full range of reference voltages (such as only the coarse reference voltages provided to coarse converter 103). In that case, reference switch network 102 selects one or more of the reference voltages from reference ladder 105 based on control signal 120, and fine converter 104 uses those one or more selected reference voltages to generate (e.g., by interpolating between comparators) a set of fine reference voltages for converting stable input signal 112.

In this embodiment, a two-stage ADC circuit is utilized. One skilled in the art will recognize that a multi-stage converter that uses any number of converter modules (i.e., a coarse converter and one or more progressively finer converters) to generate different sets of bit values for the converted input signal may be employed without deviating from the spirit and scope of the present invention as recited in the attached claims. Moreover, the division of digital output signal 117 into multiple sets of bit values does not require the different sets to have the same number of bits.

Figure 4:
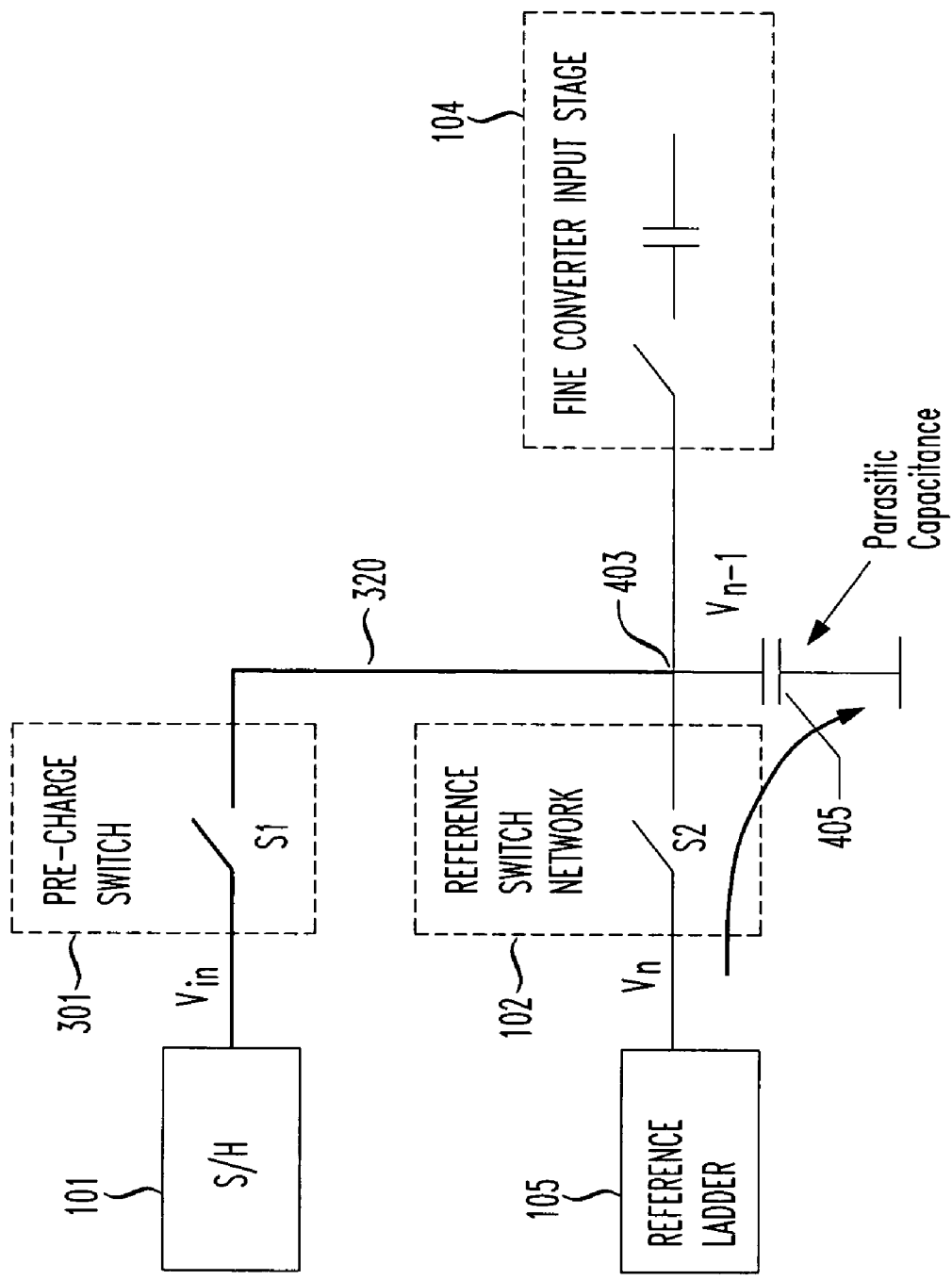
FIG. 4 illustrates a signal flow diagram for one of the fine reference voltages in the ADC of FIG. 3.
Figure 5:
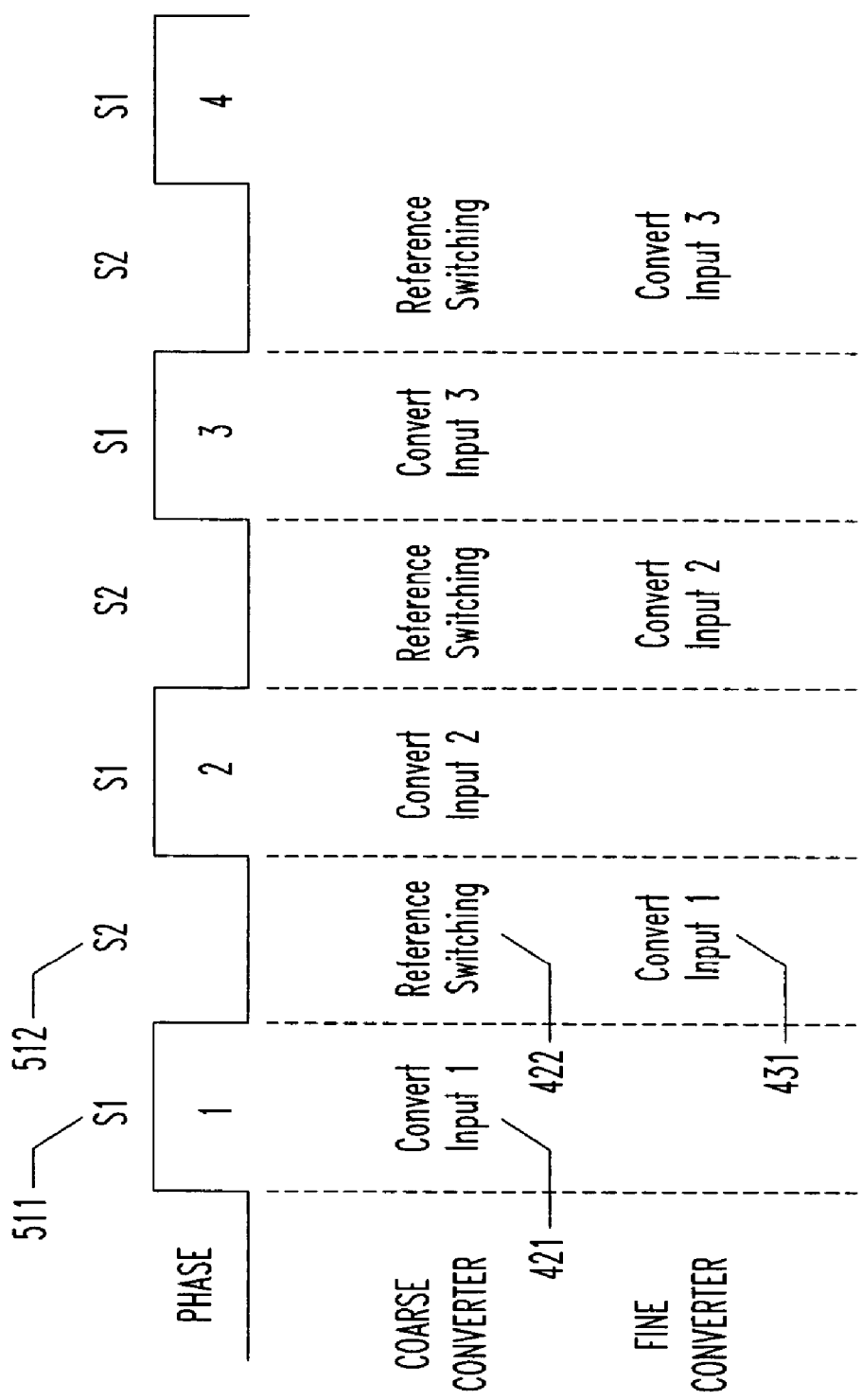
FIG. 5 illustrates a timing diagram for the ADC of FIG. 3.

FIG. 4 illustrates a signal flow diagram for one of the fine reference voltages in ADC 300 of FIG. 3, and FIG. 5 illustrates a timing diagram for ADC 300. FIG. 4 shows the new signal path from S/H module 101 through pre-charge switch 301 to reference input node 403 of fine converter 104. Although not shown in FIG. 4, input signal 112 is also applied (in a non-switched manner) to the signal input node of fine converter 104, as illustrated in FIG. 3.

As represented in FIG. 5, during the first phase (511) of the conversion cycle for an initial input signal (i.e., Input 1), while coarse converter 103 converts input signal 112 into the corresponding MSB values (421), switch S1 of FIG. 4 is closed to apply pre-charge signal 320 to pre-charge parasitic capacitance 405 at reference input node 403 of fine converter 104, while switch S2 in reference switch network 102 is open. This reference voltage pre-charge process pulls the voltage of reference input node 403 of fine converter 104 to the level of input signal 112 and therefore to a level in the neighborhood of the fine reference voltage for the upcoming second phase.

At the beginning of the second phase (512) of the conversion cycle for Input 1, switch S1 turns off and switch S2 turns on (422) to apply the appropriate fine reference voltages to enable fine converter 104 to convert input signal 112 into the corresponding LSB values (431). At the end of the second phase, the MSB and LSB values are combined together and latched out as final conversion results 117 of the ADC for Input 1.

The above-described timing sequence is repeated to generate a digital conversion output value 117 for each successive input signal value 111.

Pre-charge of reference input node 403 of fine converter 104 reduces the settling error during the reference switching process in that it eliminates the input-dependent charge stored on input node 403 from the previous conversion cycle and replaces it with a voltage tracking the current input level that corresponds to a voltage close to the current fine reference level. Now the reference voltage settling process is more accurate and uniform since the difference between the initial voltage level, which is pre-charged to the current input level, and the current fine reference voltage level, is kept to within a known maximum value. This reduction in the memory effect is significant in high-speed applications where the slew rate of analog input signal 111, and therefore the slew rate of the reference switching voltage, is high and correspondingly, the time allowed for the reference switching is short.

Unlike the previous attempts mentioned above, this invention does not noticeably increase the power consumption and/or the die area of the ADC, since the settling accuracy of the pre-charge is simply not critical and the size of the switch devices for pre-charge could be made minimum. By utilizing a reference voltage pre-charge process, the disclosed embodiments for ADC circuits significantly reduce the reference settling error due to the memory effect with almost no area and power consumption penalty.

As noted above, a multi-stage ADC may be constructed using more than two converter modules. For example, an ADC could have a coarse converter and first and second fine converters, with the second fine converter being finer than the first, where the three converters generate three different sets of bit values for the digital output. In that case, depending on the particular implementation, while the coarse converter generates the first set of bit values (i.e., the MSB values), the input signal could be applied to pre-charge the reference input nodes at either or both of the two fine converters. Then, while the first fine converter generates the second set of bits (i.e., a set of intermediate bit values), the input signal could continue to pre-charge the reference input nodes at the second fine converter, which would next generate the LSB values.

Although the present invention has been described in the context of ADCs having coarse and fine converters implemented using comparator-based converters, the present invention can be implemented using any suitable, and possibly different, types of converter modules for the coarse and fine converters.

Although the present invention has been described in the context of ADCs having a reference-voltage supply consisting of a reference ladder and a reference switch network, the present invention can be implemented in the context of ADCs having other configurations of reference-voltage supplies designed to generate the reference voltages for the coarse and fine converters.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. An analog-to-digital converter (ADC) for converting an analog input signal into a digital output signal, the ADC comprising:
    a coarse converter adapted to convert the analog input signal into one or more coarse bits for the digital output signal during an initial phase of a conversion cycle for the ADC;
    at least one fine converter adapted to convert the analog input signal into one or more fine bits for the digital output signal during a subsequent phase of the conversion cycle;
    a sample-and-hold module adapted to generate a stable version of the analog input signal for application to a signal input node of the fine converter;
    a reference-voltage supply adapted to generate and apply one or more fine reference voltages to one or more reference input nodes of the fine converter for use by the fine converter during the subsequent phase of the conversion cycle;
    switch circuitry connected between the sample-and-hold module and at least one reference input node of the fine converter and adapted to selectively apply the stable version of the analog input signal from the sample-and-hold module to the at least one reference input node of the fine converter; and
    an encoder module adapted to combine the coarse and fine bits to generate the digital output signal, wherein:
        during the initial phase of the conversion cycle, the switch circuitry applies the stable version of the analog input signal from the sample-and-hold module to the at least one reference input node of the fine converter to pre-charge the at least one reference input node.

2. The invention of claim 1, wherein the sample-and-hold module is further adapted to apply the stable version of the analog input signal for use by the coarse converter.

3. The invention of claim 1, wherein the reference-voltage supply comprises:
    a reference ladder adapted to generate a full range of reference voltages, wherein a coarse subset of the reference voltages are applied to the coarse converter; and
    a reference switch network adapted to select a fine subset of the reference voltages for application to the fine converter, wherein, during the initial phase of the conversion cycle, the reference switch network does not apply any reference voltage to the at least one reference input node of the fine converter.

4. The invention of claim 3, wherein the reference switch network is adapted to select the fine subset of reference voltages based on a control signal (1) generated by the coarse converter during the initial phase of the conversion cycle and (2) based on the one or more coarse bits.

5. The invention of claim 1, wherein the reference-voltage supply comprises:
    a reference ladder adapted to generate a subset of a full range of reference voltages, wherein one or more of the reference voltages in the subset are applied to the coarse converter; and
    a reference switch network adapted to select one or more of the reference voltages in the subset for application to the fine converter, wherein the fine converter is adapted to generate a set of fine reference voltages from the one or more selected reference voltages, wherein, during the initial phase of the conversion cycle, the reference switch network does not apply any reference voltage to the at least one reference input node of the fine converter.

6. The invention of claim 5, wherein the reference switch network is adapted to select the one or more reference voltages based on a control signal (1) generated by the coarse converter during the initial phase of the conversion cycle and (2) based on the one or more coarse bits.

7. The invention of claim 1, wherein the ADC is implemented in a single integrated circuit.

8. The invention of claim 1, wherein:
    the fine converter is adapted to convert the analog input signal into a plurality of fine bits for the digital output signal during the subsequent phase of the conversion cycle;
    the reference-voltage supply is adapted to generate and apply a plurality of fine reference voltages to a plurality of reference input nodes of the fine converter for use by the fine converter during the subsequent phase of the conversion cycle; and
    during the initial phase of the conversion cycle, the switch circuitry applies the stable version of the analog input signal to each reference input node of the fine converter to pre-charge the reference input node.

9. The invention of claim 1, wherein, during the initial phase of the conversion cycle, no signal other than the stable version of the analog input signal from the sample-and-hold module is applied to the at least one reference input node of the fine converter.

10. The invention of claim 1, wherein, during the subsequent phase of the conversion cycle, the stable version of the analog input signal is not applied to the at least one reference input node.

11. A method for converting an analog input signal into a digital output signal, the method comprising:
    converting, by a coarse converter, the analog input signal into one or more coarse bits for the digital output signal during an initial phase of an ADC conversion cycle;
    generating, using a sample-and-hold module, a stable version of the analog input signal for application to a signal input node of a fine converter;
    selectively applying the stable version of the analog input signal from the sample-and-hold module to at least one reference input node of the fine converter;
    generating and applying one or more fine reference voltages to one or more reference input nodes of the fine converter for use by the fine converter during a subsequent phase of the conversion cycle;
    converting, by the fine converter, the analog input signal into one or more fine bits for the digital output signal during the subsequent phase of the conversion cycle; and
    combining the coarse and fine bits to generate the digital output signal, wherein:
        during the initial phase of the conversion cycle, the stable version of the analog input signal from the sample-and-hold module is applied to the at least one reference input node of the fine converter to pre-charge the at least one reference input node.

12. The invention of claim 11, wherein a switch selectively applies the stable version of the analog input signal from the sample-and-hold module to the at least one reference input node.

13. The invention of claim 11, further comprising applying the stable version of the analog input signal for use by the coarse converter.

14. The invention of claim 11,
a full range of reference voltages is generated;
a coarse subset of the reference voltages is applied to the coarse converter; and
a fine subset of the reference voltages is selected for application to the fine converter, wherein, during the initial phase of the conversion cycle, no reference voltage is applied to the at least one reference input node of the fine converter.

15. The invention of claim 14, wherein the fine subset of reference voltages is selected based on a control signal (1) generated by the coarse converter during the initial phase of the conversion cycle and (2) based on the one or more coarse bits.

16. The invention of claim 11, wherein:
a subset of a full range of reference voltages is generated, wherein one or more of the reference voltages in the subset are applied to the coarse converter; and
one or more of the reference voltages in the subset are selected for application to the fine converter, wherein the fine converter generates a set of fine reference voltages from the one or more selected reference voltages, wherein, during the initial phase of the conversion cycle, no reference voltage is applied to the at least one reference input node of the fine converter.

17. The invention of claim 16, wherein the one or more reference voltages are selected based on a control signal (1) generated by the coarse converter during the initial phase of the conversion cycle and (2) based on the one or more coarse bits.

18. The invention of claim 11, wherein the method is implemented in a single integrated circuit.

19. The invention of claim 11, wherein:
the analog input signal is converted into a plurality of fine bits for the digital output signal during the subsequent phase of the conversion cycle;
a plurality of fine reference voltages are generated and applied to a plurality of reference input nodes of the fine converter for use by the fine converter during the subsequent phase of the conversion cycle; and
during the initial phase of the conversion cycle, the stable version of the analog input signal from the sample-and-hold module is applied to each reference input node of the fine converter to pre-charge the reference input node.

20. The invention of claim 11, wherein, during the initial phase of the conversion cycle, no signal other than the stable version of the analog input signal from the sample-and-hold module is applied to the at least one reference input node of the fine converter.

21. The invention of claim 11, wherein, during the subsequent phase of the conversion cycle, the stable version of the analog input signal is not applied to the at least one reference input node.

22. An integrated circuit comprising an ADC for converting an analog input signal into a digital output signal, the ADC comprising:
a coarse converter adapted to convert the analog input signal into one or more coarse bits for the digital output signal during an initial phase of a conversion cycle for the ADC;
at least one fine converter adapted to convert the analog input signal into one or more fine bits for the digital output signal during a subsequent phase of the conversion cycle;
a sample-and-hold module adapted to generate a stable version of the analog input signal for application to a signal input node of the fine converter;
a reference-voltage supply adapted to generate and apply one or more fine reference voltages to one or more reference input nodes of the fine converter for use by the fine converter during the subsequent phase of the conversion cycle;
switch circuitry connected between the sample-and-hold module and at least one reference input node of the fine converter and adapted to selectively apply the stable version of the analog input signal from the sample-and-hold module to the at least one reference input node of the fine converter; and
an encoder module adapted to combine the coarse and fine bits to generate the digital output signal, wherein:
during the initial phase of the conversion cycle, the switch circuitry applies the stable version of the analog input signal from the sample-and-hold module to the at least one reference input node of the fine converter to pre-charge the at least one reference input node.

23. The invention of claim 22, wherein, during the initial phase of the conversion cycle, no signal other than the stable version of the analog input signal from the sample-and-hold module is applied to the at least one reference input node of the fine converter.

24. The invention of claim 22, wherein, during the subsequent phase of the conversion cycle, the stable version of the analog input signal is not applied to the at least one reference input node.

* * * * *